(12) United States Patent
Kimura (10) Patent No.: US 12,131,062 B2
(45) Date of Patent: Oct. 29, 2024

(54) MEMORY SYSTEM

(71) Applicant: Kioxia Corporation, Tokyo (JP)

(72) Inventor: Fuminori Kimura, Kanagawa (JP)

(73) Assignee: Kioxia Corporation, Tokyo (JP)

( * ) Notice: Subject to any disclaimer, the term of this patent is extended or adjusted under 35 U.S.C. 154(b) by 322 days.

(21) Appl. No.: 17/839,896

(22) Filed: Jun. 14, 2022

(65) Prior Publication Data

US 2023/0297272 A1    Sep. 21, 2023

(30) Foreign Application Priority Data

Mar. 18, 2022    (JP) ................................ 2022-044455

(51) Int. Cl.
*G06F 3/06*        (2006.01)
*H05K 1/14*        (2006.01)
*H05K 1/18*        (2006.01)

(52) U.S. Cl.
CPC .......... *G06F 3/0658* (2013.01); *G06F 3/0625* (2013.01); *G06F 3/0679* (2013.01); *H05K 1/147* (2013.01); *H05K 1/141* (2013.01); *H05K 1/181* (2013.01); *H05K 1/182* (2013.01); *H05K 2201/10015* (2013.01)

(58) Field of Classification Search
CPC .... G06F 3/0658; G06F 3/0625; G06F 3/0679; H05K 1/147; H05K 1/141; H05K 1/181; H05K 1/182; H05K 2201/10015
USPC ........................................................ 361/763
See application file for complete search history.

(56) References Cited

U.S. PATENT DOCUMENTS

| | | | |
|---|---|---|---|
| 9,519,319 B2 | 12/2016 | Dean et al. | |
| 2004/0104469 A1* | 6/2004 | Yagi | G11C 5/063 |
| | | | 257/723 |
| 2010/0128447 A1 | 5/2010 | MacDougall et al. | |
| 2015/0261265 A1* | 9/2015 | Dean | G01R 31/2891 |
| | | | 361/679.46 |

FOREIGN PATENT DOCUMENTS

| | | |
|---|---|---|
| JP | 2010-123119 A | 6/2010 |
| JP | 3176698 U | 6/2012 |

* cited by examiner

*Primary Examiner* — Binh B Tran
(74) *Attorney, Agent, or Firm* — Foley & Lardner LLP

(57) ABSTRACT

A memory system of an embodiment includes a memory, a controller configured to control the memory, and a first board on which the memory and the controller are mounted. The memory system further includes a module component including at least one capacitor, a second board, and a wiring member, each of the at least one capacitor including a lead, the at least one capacitor being mounted on the second board, the wiring member being electrically connected to the lead of the at least one capacitor and extending from the second board. The first board and the module component are connected to each other via the wiring member.

17 Claims, 7 Drawing Sheets

MEMORY SYSTEM

CROSS-REFERENCE TO RELATED APPLICATION

This application is based upon and claims the benefit of priority from the prior Japanese Patent Application No. 2022-044455 filed in Japan on Mar. 18, 2022, the entire contents of which are incorporated herein by reference.

FIELD

Embodiments described herein relate generally to a memory system.

BACKGROUND

A memory system that uses a NAND memory is known as a semiconductor storage device. The memory system uses a volatile memory for controlling the NAND memory. There is a known memory system where a NAND memory and a volatile memory are housed in a housing. Dimensions of the housing of the memory system are restricted in accordance with various standards. As a result, there is a limitation on the size and the shape of electronic components that can be mounted on a board in the memory system. There may be a case where a backup power supply is included in a memory system that includes a volatile memory. The memory system performs power loss protection (PLP) processing by using the backup power supply. Tantalum capacitors or aluminum electrolytic capacitors are used as the backup power supply. These components require a large mounting area, thus being significantly affected by dimensional restrictions of the housing.

DETAILED DESCRIPTION

A memory system of an embodiment includes a memory, a controller configured to control the memory, and a first board on which the memory and the controller are mounted. The memory system further includes a module component including at least one capacitor, a second board, and a wiring member, each of the at least one capacitor including a lead, the at least one capacitor being mounted on the second board, the wiring member being electrically connected to the lead of the at least one capacitor and extending from the second board. The first board and the module component are connected to each other via the wiring member.

Hereinafter, embodiments of the present invention will be described in detail with reference to drawings.

First Embodiment

In a memory system of the present embodiment, capacitors are mounted on a substrate (or a circuit board) to form a module, and the module is connected to another substrate (or another circuit board) where other electronic components are mounted. With such a configuration, a mounting space for a semiconductor storage device can be allocated, and repairability can be improved.

In the description made hereinafter, drawings based on the embodiment are schematic views. Note that a relationship (dimensional relationship) between the length and the width of a constitutional element, a ratio between lengths of respective parts, for example, may differ from actual ones. The dimensional relationship and the ratio may be partially different between a plurality of drawings. Further, the illustration of some constitutional elements may be omitted.

Figure 1:
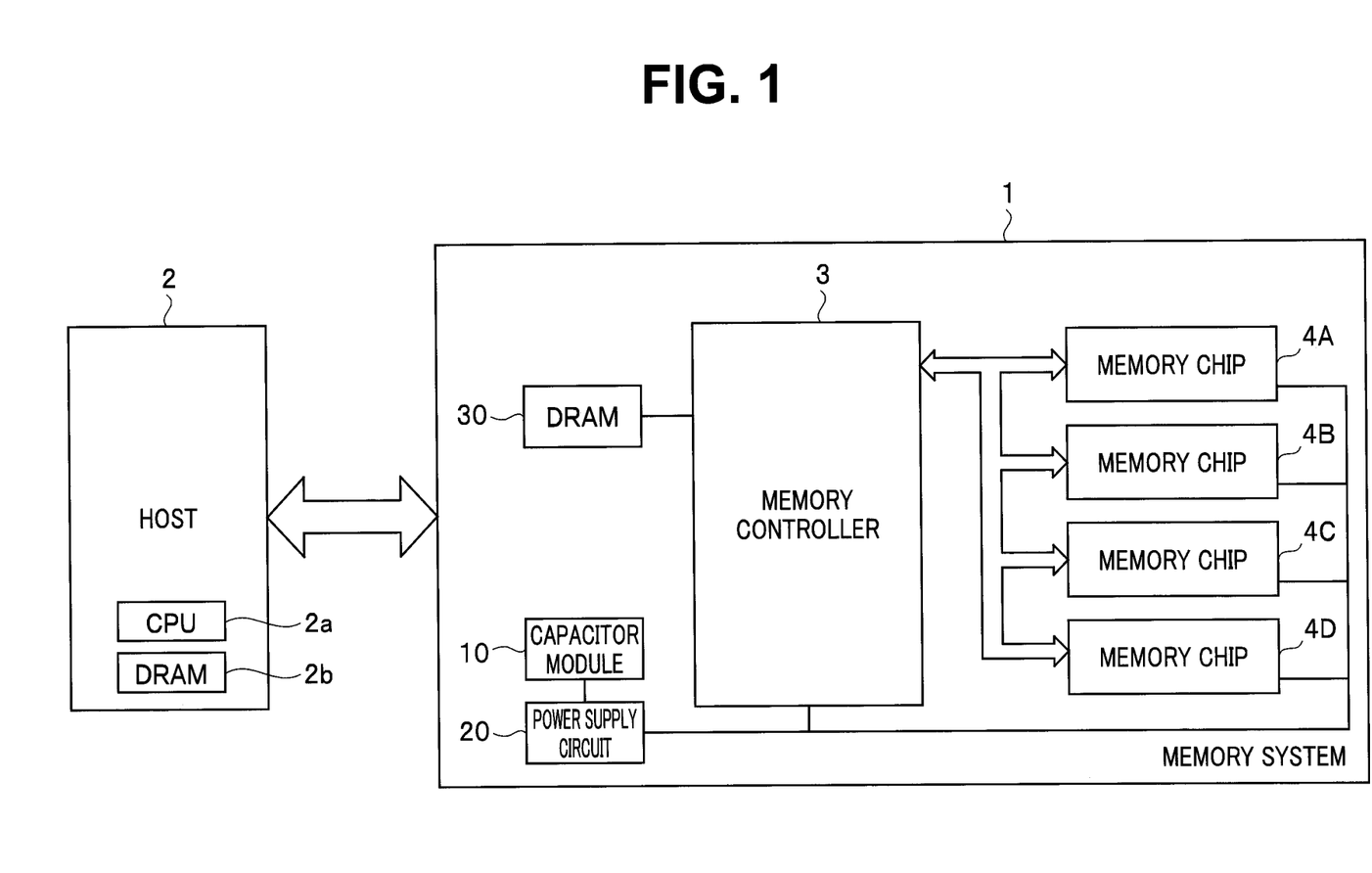
FIG. 1 is a block diagram showing a memory system according to a present embodiment.

FIG. 1 is a block diagram showing the memory system according to the present embodiment. In the present embodiment, the description will be made for the memory system that includes a capacitor module on which capacitors are mounted.

A memory system 1 of the present embodiment includes a memory controller 3, four memory chips 4A to 4D, a capacitor module 10, a power supply circuit 20, and a DRAM 30. Hereinafter, in a case where it is not necessary to differentiate the four memory chips 4A to 4D, a representative memory chip is referred to as a "memory chip 4". Note that the number of memory chips 4 is not limited to four, and it is possible to adopt any number of memory chips, any number being one or more.

The memory system 1 can be connected to a host 2. The host 2 is electronic equipment, such as a personal computer, a mobile terminal, an on-vehicle device, or a server. The host 2 includes a central processing unit (CPU) 2a serving as a processor, a ROM (not shown in the drawing), and a DRAM 2b. In response to a request from the host 2, the memory system 1 stores user data (hereinafter simply referred to as "data") from the host 2 into the memory chips 4, or reads data stored in the memory chips 4 and outputs the data to the host 2. Specifically, the memory system 1 can write data to the memory chips 4 in response to a write request from the host 2 and can read data from the memory chips 4 in response to a read request from the host 2.

The memory system 1 is a solid state drive (SSD) where at least the memory controller 3, the plurality of memory chips 4, the power supply circuit 20, and the DRAM 30 are mounted on a substrate. FIG. 1 shows a state where the memory system 1 is connected to the host 2.

Each memory chip 4 is a semiconductor storage device configured of a NAND flash memory or the like which stores data in a nonvolatile manner. As shown in FIG. 1, the memory controller 3 is connected to the respective memory chips 4 via a NAND bus. The memory controller 3 controls writing of data to the memory chip 4 in response to a write request from the host 2. The memory controller 3 also controls reading of data from the memory chip 4 in response to a read request from the host 2. There may be a case where the memory controller 3 controls writing and reading of data to and from the memory chip 4 spontaneously instead of in response to a request from the host 2.

The power supply circuit 20 receives a supply of external power from the outside of the memory system 1. The power supply circuit 20 generates a desired internal voltage from an external voltage. The power supply circuit 20 supplies the generated internal voltage to at least the memory controller 3 and the plurality of memory chips 4. The capacitor module 10 includes capacitors, and is used as a backup power supply. During a period in which a supply of external power is interrupted, the backup power supply supplies a backup power to at least the memory controller 3 and the plurality of memory chips 4. The DRAM 30 is a volatile memory. During the period in which a supply of external power is interrupted, the memory controller 3 reads data in the DRAM 30 and write the data to the memory chip 4 by using the backup power supply.

For example, the memory system 1 forming an SSD may be adopted in a server or a storage system. Aluminum electrolytic capacitors (hereinafter simply referred to "capacitors") for power loss protection (PLP) processing may be included in such a memory system 1. The present embodiment adopts the capacitor module 10 obtained by forming capacitors into a module. The capacitors are used as a backup power supply for the power supply circuit 20. In a case where instantaneous interruption or the like occurs in an external voltage supplied from the outside of the memory system 1, it is possible to protect data stored in the DRAM 30 by using power charged in the capacitors.

Figure 2A:
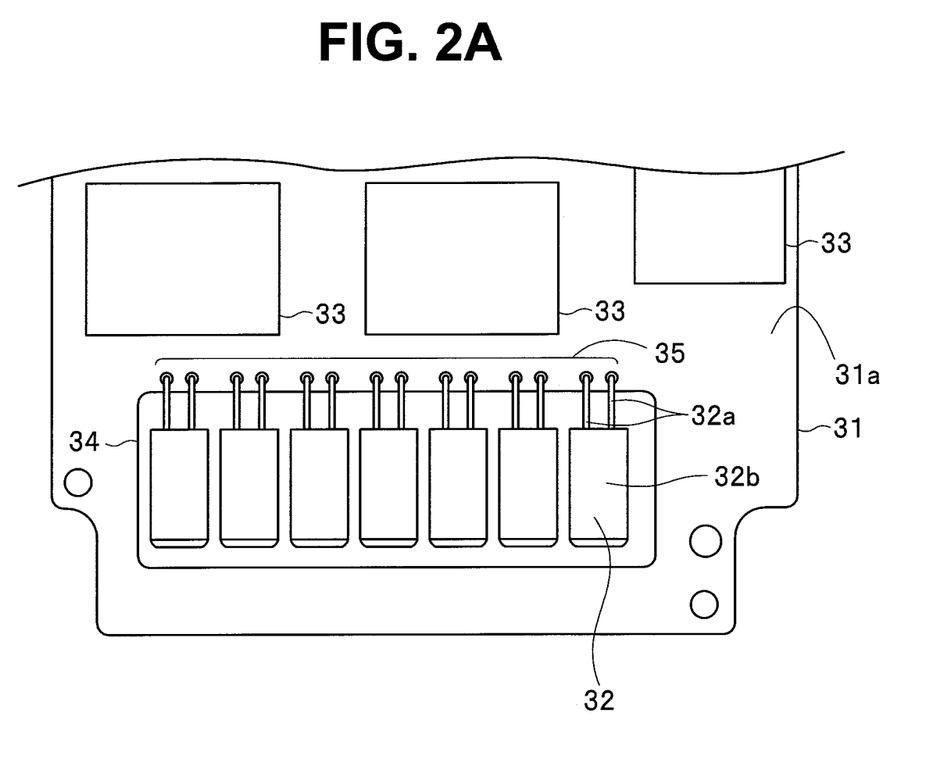
FIG. 2A is an explanatory diagram showing a comparison example.
Figure 2B:
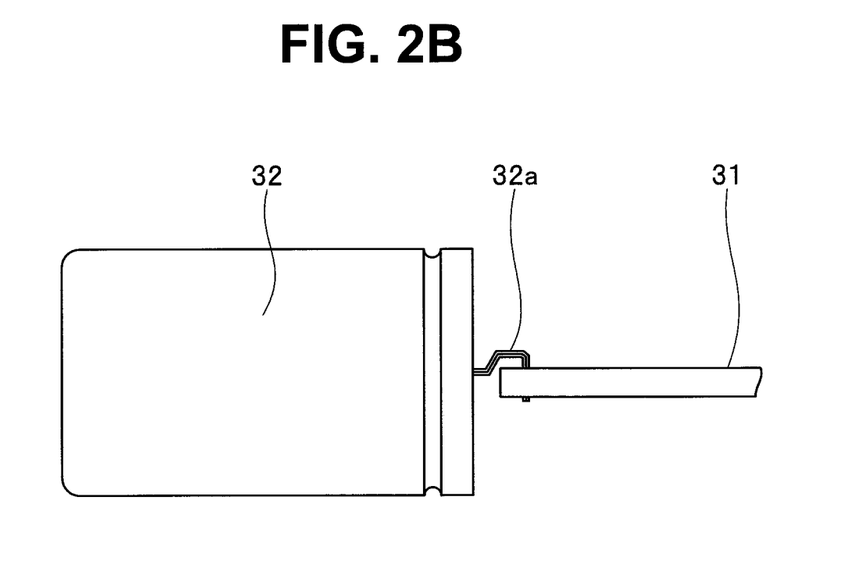
FIG. 2B is another explanatory diagram showing the comparison example.

FIG. 2A and FIG. 2B are explanatory diagrams showing a comparison example. In the comparison example shown in FIG. 2A and FIG. 2B, such capacitors are mounted in a form different from a form adopted in the present embodiment.

The comparison example shown in FIG. 2A and FIG. 2B shows a portion of an SSD board 31 in a state where capacitors 32 for PLP processing are attached. FIG. 2A shows a planar shape of a mounting surface of the SSD board 31 as viewed from above, and FIG. 2B shows the shape of a side surface of a portion where the capacitor 32 shown in FIG. 2A is attached. Various electronic components 33 which form the SSD are mounted on a mounting surface 31a of the SSD board 31. An opening portion 34 is formed in an end region of the SSD board 31, and the plurality of capacitors 32 are arranged in the opening portion 34. Each capacitor 32 has a shape where a pair of leads 32a extends from one bottom surface of a case 32b having a cylindrical shape. A land portion 35 is formed at an edge portion of the opening portion 34 formed in the SSD board 31, and is for soldering the leads 32a of the respective capacitors 32. An example of the capacitor 32 is an aluminum electrolytic capacitor.

The SSD board 31 shown in FIG. 2A and FIG. 2B is accommodated in an SSD housing not shown in the drawing. Standards for the SSD housing restrict the height (restrict the height in the direction perpendicular to the mounting surface 31a) and hence, the capacitors 32 are disposed in the opening portion 34 such that the generatrix of each case 32b is parallel to the mounting surface 31a. To attach each lead 32a to the land portion 35, the lead 32a is bent in the direction perpendicular to the mounting surface 31a.

It is necessary to attach each lead 32a to the land portion 35 by bending the lead 32a as described above and hence, a step of bending the lead 32a a plurality of times is required, and the board 31 is required to have a sufficiently large space to accommodate the lead 32a which is bent a plurality of times. Further, it is necessary to provide a large number of lands at the land portion 35 and hence, a large mounting area is required on the mounting surface 31a.

When a defect occurs in the capacitor 32, for example, it may be necessary to detach the capacitor 32. The capacitor 32 having the leads 32a is not receptive to reflow soldering. Therefore, it is necessary to cut the leads 32a of the defective capacitor 32 and detach the defective capacitor 32, and to remove remaining leads 32a by melting solders at the land portion 35. There may also be a case where it is necessary to detach another electronic component (for example, the electronic component 33) that is disposed in the periphery of the capacitor 32 and is receptive to reflow. In this case, a method may be adopted where an electronic component that is receptive to reflow is detached in a reflow furnace. Therefore, it is necessary to detach the capacitor 32 in advance and the leads 32a are cut and hence, the capacitor 32 cannot be reused and is discarded.

To solve such problems with a mounting area and repairability, the present embodiment adopts the capacitor module 10 configured by mounting at least one capacitor on a substrate (or a board).

(Capacitor Module)

Figure 3:
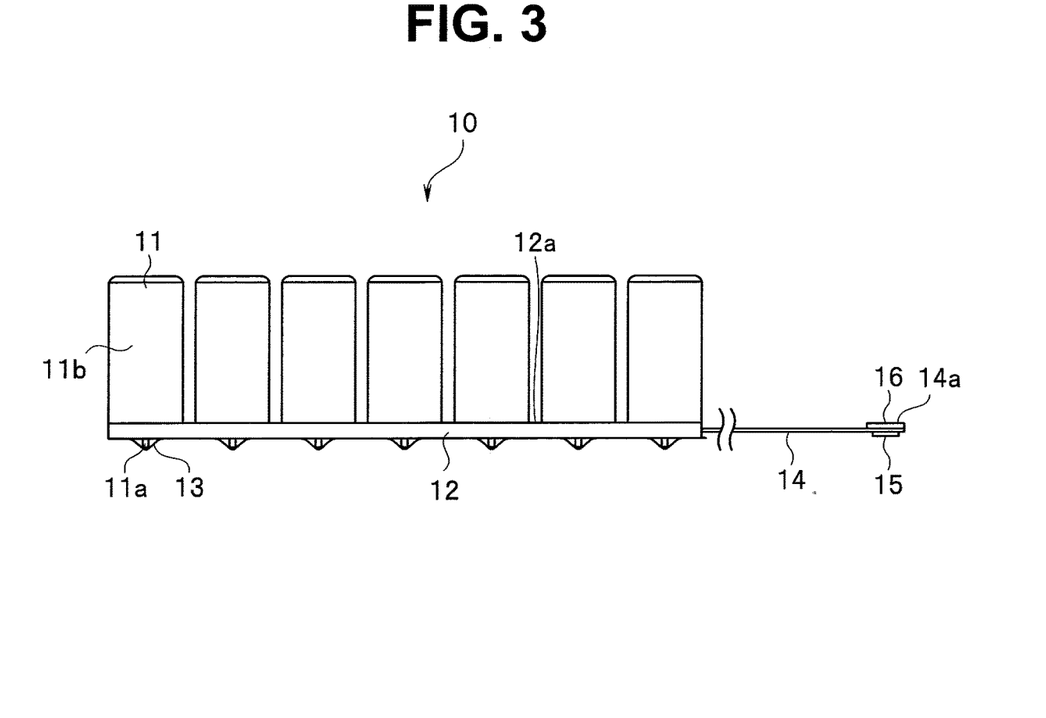
FIG. 3 is an explanatory diagram showing a capacitor module included in the memory system according to the present embodiment.
Figure 4:
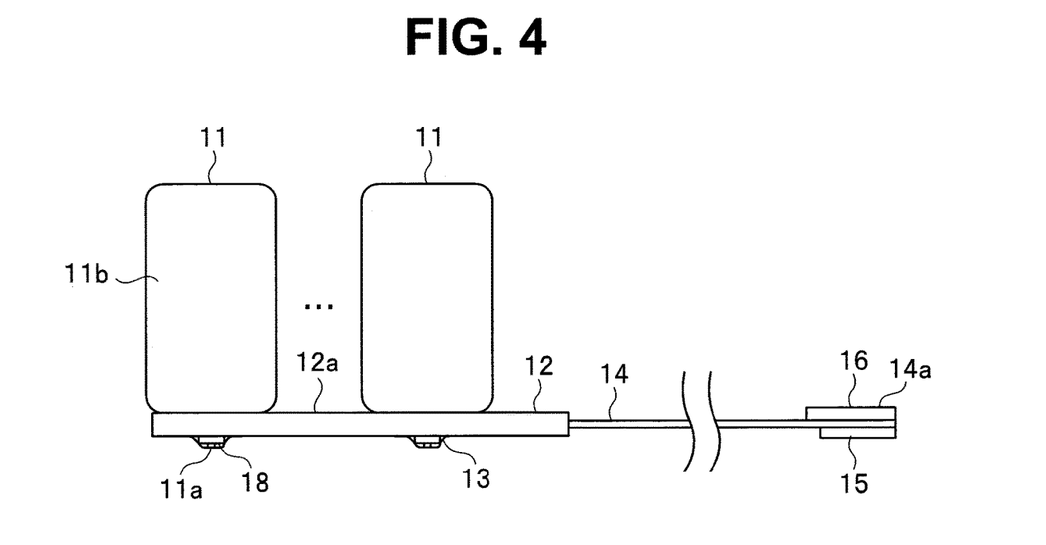
FIG. 4 is an explanatory diagram showing a portion of FIG. 3 in an enlarged manner.

FIG. 3 and FIG. 4 are explanatory diagrams showing the capacitor module adopted in the memory system according to the present embodiment. FIG. 3 is a side view of the capacitor module 10. FIG. 4 is a side view showing a portion of FIG. 3 in an enlarged manner. As shown in FIG. 3 and FIG. 4, the capacitor module 10 includes a substrate (or a board) 12, at least one capacitor 11 which is mounted on a mounting surface 12a of the substrate 12, and a wiring member 14. An example of the capacitor 11 is an aluminum electrolytic capacitor. FIG. 3 shows an example where the capacitor module 10 includes seven capacitors 11. However, the number of capacitors 11 is not limited to seven. The capacitor module 10 is used when the memory system 1 performs PLP processing, for example.

Each capacitor 11 has a shape where a pair of leads 11a extends from one bottom surface of a case 11b having a cylindrical shape. The shape of the case 11b is not limited to a cylindrical shape. Through holes not shown in the drawing are formed in the substrate 12 at positions corresponding to the respective leads 11a, and lands not shown in the drawing are formed on the surface of the substrate 12 in the periphery of the through holes. Each lead 11a of the capacitor 11 is inserted through the through hole formed in the substrate 12, and is soldered with a solder 18 (see FIG. 4) on the land.

The leads 11a (for example, the positive electrode leads 11a) each of which is one of the pair of leads 11a of each capacitor 11 are commonly connected to each other, and are connected to one wiring not shown in the drawing in the wiring member 14. The leads 11a (for example, the negative electrode leads 11a) each of which is the other of the pair of leads 11a of each capacitor 11 are commonly connected to each other, and are connected to the other wiring not shown in the drawing in the wiring member 14. That is, the respective capacitors 11 are connected in parallel to the pair of wirings in the wiring member 14. Note that a configuration may be adopted where the respective capacitors 11 are connected in series to the pair of wirings in the wiring member 14.

The mounting surface 12a of the substrate 12 is configured to have a width and a length that allows the substrate 12 to be accommodated in an opening portion 24 (see FIG. 5) formed in an SSD board 21 which will be described later. The capacitors 11 are disposed such that the generatrix of each case 11b is perpendicular to the mounting surface 12a. Accordingly, when the capacitor 11 is mounted on the mounting surface 12a, it is not necessary to bend the leads 11a, and the leads 11a can be soldered to the land with the solder 18 in a state where one bottom surface of the case 11b from which the leads 11a extend is brought into contact with or facing the mounting surface 12a and the leads 11a are inserted through the through holes. As described above, by mounting at least one capacitor 11 on the mounting surface 12a of the substrate 12 with the bottom surface of the case 11b brought into contact with or facing the mounting surface 12a of the substrate 12 and by electrically connecting at least one capacitor 11 by the wiring member 14, it is possible to form the capacitor module 10 having no wasted space in the direction perpendicular to the mounting surface 12a.

The description has been made for the configuration where the capacitor module 10 is configured of aluminum electrolytic capacitors with leads. However, even when aluminum electrolytic capacitors or tantalum capacitors of a surface mount technology (SMT) type are used as mounting components, it is also possible to form the capacitor module 10.

The wiring member 14 may be configured of a flexible member, such as an FPC (flexible printed circuit board). As described above, the wiring member 14 includes the pair of wirings that are respectively connected to the pair of leads 11a of each capacitor 11. An end portion 14a of the wiring member 14 is provided with a pair of terminal portions 15 which are respectively connected to the pair of wirings. A reinforcing plate 16 is provided to a surface of the end portion 14a of the wiring member 14 on a side opposite to the terminal portions 15.

The substrate 12 and the wiring member 14 may be configured of a rigid flexible board, for example. That is, the substrate 12 is configured of a rigid portion of the rigid flexible board, and the wiring member 14 is configured of a flex portion of the rigid flexible board. The rigid portion is configured by stacking a rigid layer and a flexible layer. The flexible layer extends from the rigid portion as the wiring member 14, thus forming the flex portion. When the substrate 12 and the wiring member 14 are configured of a rigid flexible board, a connection connector between the substrate 12 and the wiring member 14 is unnecessary and hence, it is possible to save space.

FIG. 3 and FIG. 4 show an example where an insulating tape 13 that covers the leads 11a and the solder 18 is provided to prevent the lead 11a of the capacitor 11 and the solder 18 from coming into electrical contact with another member. The insulating tape 13 is not an indispensable component of the capacitor module 10. A configuration may be adopted where a resin or the like having insulating property is provided when necessary at portions where the lead 11a and the solder 18 come into contact with other members.

(Attaching)

Figure 5:
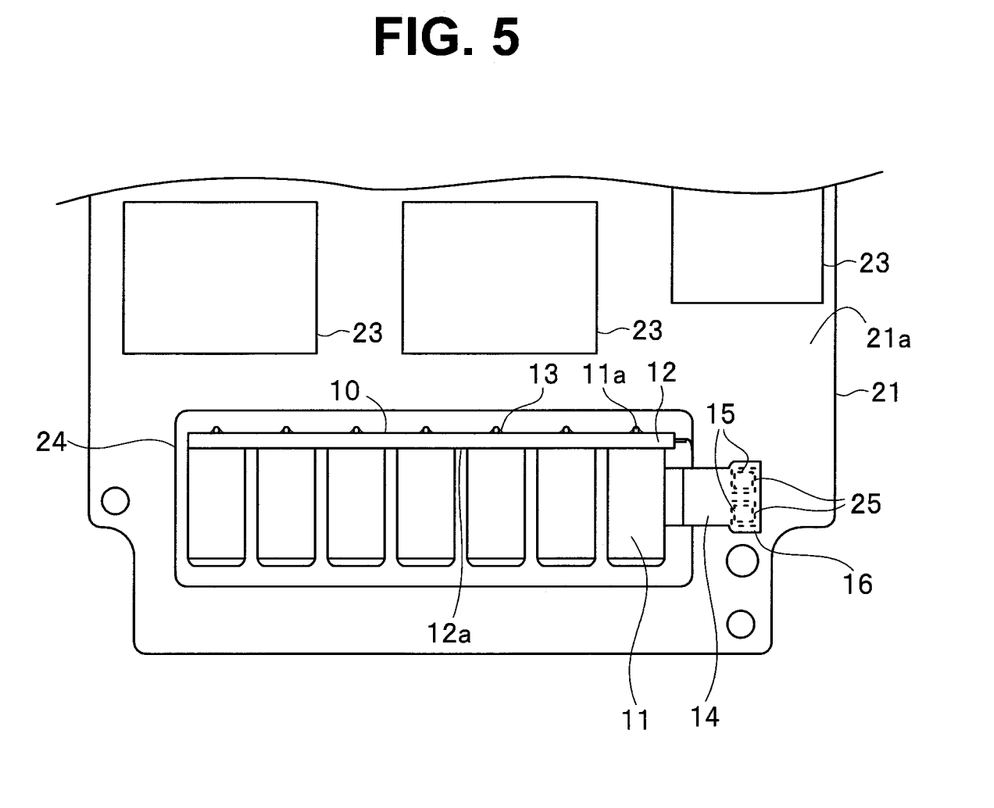
FIG. 5 is an explanatory diagram showing a state where the capacitor module shown in FIG. 3 is attached to an SSD board.

FIG. 5 shows one example of a method for attaching the capacitor module 10 to the SSD board 21.

In FIG. 5, various electronic components 23, including the memory chips 4 and the memory controller 3, are mounted on a mounting surface 21a of the SSD board 21. The opening portion 24 is formed in an end region of the SSD board 21, and the capacitor module 10 is disposed in the opening portion 24. The mounting surface 21a of the SSD board 21 is provided with a pair of connection terminals 25 to connect the SSD board 21 to the capacitor module 10. To attach the terminal portions 15 of the capacitor module 10 to the connection terminals 25 of the SSD board 21, it is necessary to bend the wiring member 14, which extends from the substrate 12, three times. The number of times of bending and a bending method may be suitably decided. An example is presented where the straight wiring member 14 is bent. However, by using the wiring member 14 bent in a desired direction, it is possible to reduce the number of times of bending.

As shown in FIG. 5, the capacitor module 10 is disposed along an edge portion of the opening portion 24 such that the mounting surface 12a is orthogonal to the mounting surface 21a of the SSD board 21. FIG. 5 shows an example where the mounting surface 12a is orthogonal to the mounting surface 21a. However, it is not always necessary for the mounting surface 12a to be orthogonal to the mounting surface 21a, and it is sufficient to dispose the capacitor module 10 such that the mounting surface 12a intersects with the mounting surface 21a. The terminal portions 15 are provided to the end portion 14a of the wiring member 14, extending from an end portion of the substrate 12. The terminal portions 15 are made to overlap with the connection terminals 25 on the mounting surface 21a, and soldering is then performed by thermocompression, which is an existing technique, at portions of the reinforcing plate 16. With such operations, wiring and the electronic components 23 provided to the SSD board 21 are electrically connected to the capacitors 11.

In the arrangement shown in FIG. 5, the insulating tapes 13 are provided to prevent the leads 11a of each capacitor 11 or the solders 18 from electrically coming into contact with the edge portion of the opening portion 24 formed in the SSD board 21. In place of the insulating tape 13, a resin or the like having insulating property may be interposed between the leads 11a of each capacitor 11 or each solder 18 and the SSD board 21.

(Accommodating)

Figure 6:
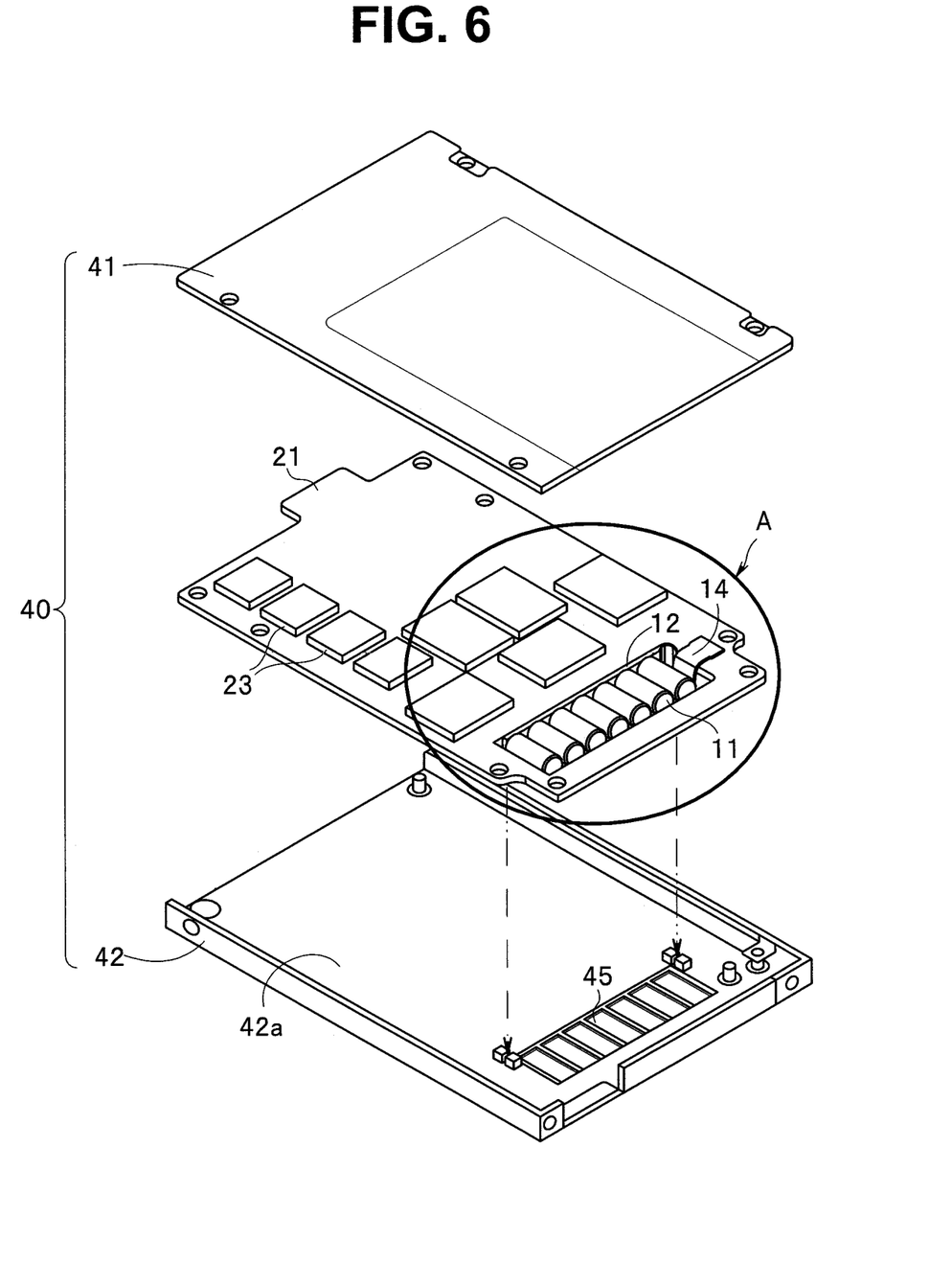
FIG. 6 is an explanatory diagram showing one example of a case that accommodates the SSD board to which the capacitor module is attached.
Figure 7:
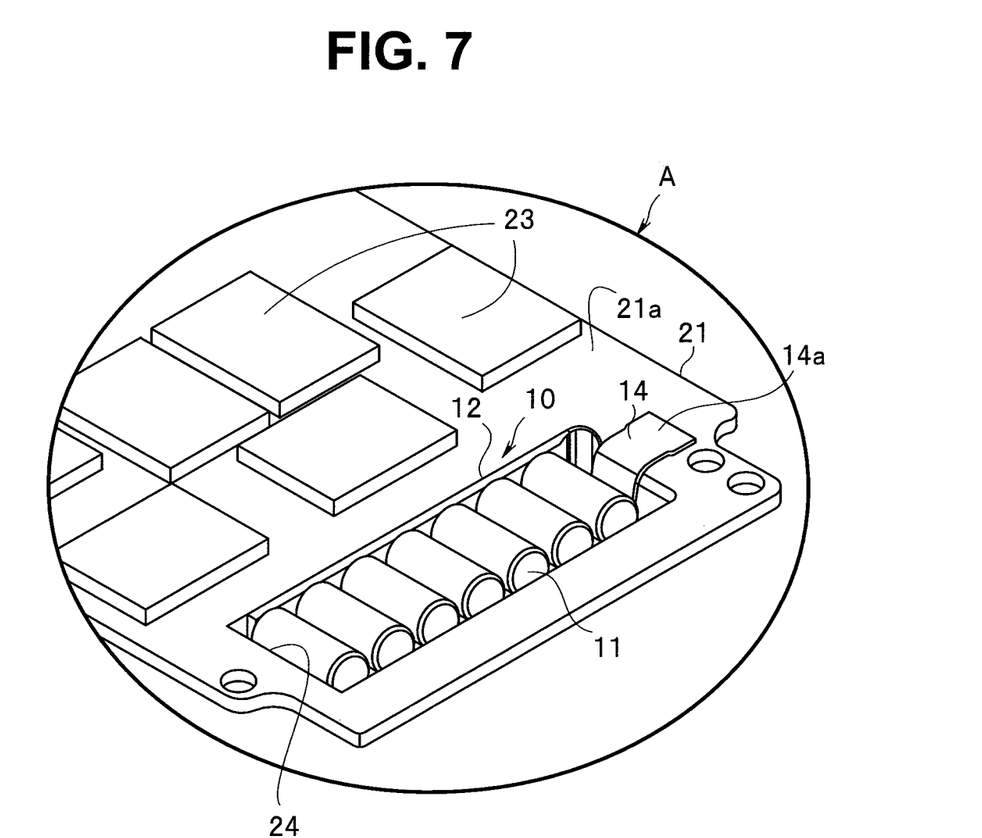
FIG. 7 is an explanatory diagram showing a portion of FIG. 6 in an enlarged manner.

FIG. 6 is an explanatory diagram showing one example of an accommodating case that accommodates the SSD board 21 into which the capacitor module 10 is incorporated. FIG. 7 is an explanatory diagram showing a portion A of FIG. 6 in an enlarged manner.

The SSD board 21 to which the capacitor module 10 is attached is accommodated in an accommodating case 40. The accommodating case 40 includes an upper surface cover 41 and a bottom surface cover 42. The accommodating case 40 has, for example, a dimension complying with the SFF-TA-1008 standard. The SSD board 21 is disposed on an accommodation surface 42a of the bottom surface cover 42 such that a surface of the SSD board 21 on a side opposite to the mounting surface 21a faces the accommodation surface 42a of the bottom surface cover 42. The SSD board 21 is fixed to the bottom surface cover 42 by engaging members provided to the SSD board 21 and the bottom surface cover 42 at mutually corresponding positions. Further, the upper surface cover 41 is disposed to face the mounting surface 21a of the SSD board 21, and the upper surface cover 41 and the bottom surface cover 42 are then fastened with each other by fastening members. With such operations, the SSD board 21 is accommodated in the accommodating case 40, including the upper surface cover 41 and the bottom surface cover 42. When the SSD board 21 is accommodated in the accommodating case 40, the capacitor module 10 is fixed to the accommodating case 40 in a state of being sandwiched between the upper surface cover 41 and the bottom surface cover 42. When the capacitor module 10 is sandwiched between the upper surface cover 41 and the bottom surface cover 42, a heat conductive sheet or heat conductive grease may be interposed as a cushioning member.

Depending on the diameter size of each capacitor 11, as shown in FIG. 6, a protruding portion 45 that corresponds to the shape of each capacitor 11 may be formed on the accommodation surface 42a of the bottom surface cover 42. With such a structure, it is possible to increase adhesion between the capacitors 11 and the bottom surface cover 42 with the above-mentioned heat conductive grease interposed therebetween. Although not shown in the drawing, the upper surface cover 41 may also have a shape substantially equivalent to the shape of the bottom surface cover 42.

Advantageous Effects

In the embodiment having such a configuration, it is possible to attach the capacitors 11 to the substrate 12 without bending the leads 11a. Therefore, it is not necessary to bend the lead 11a, and the bottom surface of each capacitor 11 (the bottom surface of each case 11b) can be brought into contact with of facing the substrate 12, thus reducing the size in the direction perpendicular to the mounting surface 12a of the substrate 12. Further, it is not necessary to solder the leads 11a to the mounting surface 21a of the SSD board 21, so that it is not necessary to form a land portion for soldering on the mounting surface 21a and hence, it is possible to allocate the mounting area of the SSD board 21.

The capacitor module 10 is electrically connected to the electronic components 23, which are mounted on the SSD board 21, by thermocompression soldering at the end portion 14a of the wiring member 14, the end portion 14a being located at a position relatively away from the substrate 12. Accordingly, when making repairs, by melting the solder by heating a portion to which thermocompression is performed, the capacitor module 10 can be easily detached by removing the wiring member 14 from the SSD board 21. As described above, the present embodiment has the advantageous effects that repairability is improved and the capacitor module 10 can be reused. Further, before the capacitor module 10 is attached to the SSD board 21, it is possible to test the capacitors 11 of the capacitor module 10 as a single body, and it is also possible to perform screening for initial defects.

The above-mentioned embodiment shows an example where the capacitor module is configured of a rigid flexible board. However, the capacitor module may be configured of a flexible board. For example, a configuration may be adopted where a reinforcing plate is provided to a flexible board, and capacitors are mounted on the flexible board to which the reinforcing plate is provided.

In the present embodiment, the description has been made by taking the capacitor module 10 as an example. However, when various electronic components are adopted in place of the capacitors, it is possible to form a module including a substrate, a flexible board, and the electronic components. The description has been made by taking the SSD board as an example of a substrate to which such a module is connected. However, such a substrate is not limited to the SSD board, and it is possible to adopt a substrate used in electronic equipment that achieves various functions.

Second Embodiment

Figure 8:
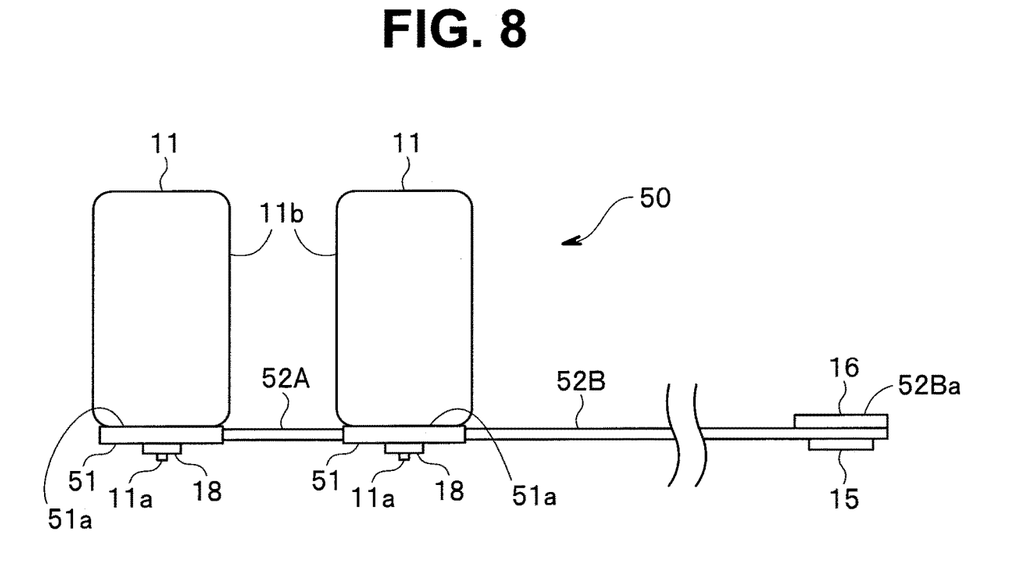
FIG. 8 is an explanatory diagram showing a capacitor module included in a memory system according to a second embodiment.
Figure 9:
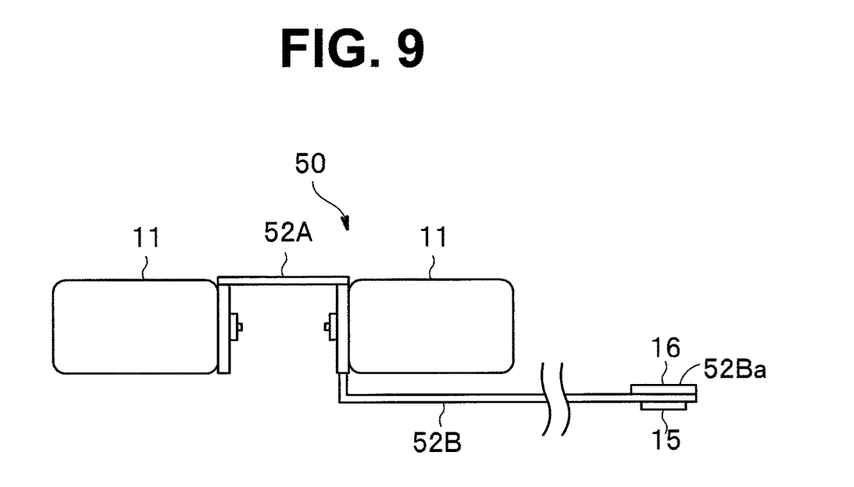
FIG. 9 is an explanatory diagram of the capacitor module shown in FIG. 8.

FIG. 8 and FIG. 9 are explanatory diagrams showing a second embodiment. In FIG. 8, constitutional elements identical to the corresponding constitutional elements in FIG. 3 are given the same reference symbols, and the description of such constitutional elements will be omitted.

In the capacitor module 10 in the first embodiment, the plurality of capacitors 11 are arranged in one row on one substrate 12. The present embodiment has a configuration that can increase the degree of freedom in arrangement of the plurality of capacitors 11.

A capacitor module 50 shown in FIG. 8 includes a plurality of substrates (or boards) 51, at least one capacitor 11, a wiring member 52A, and a wiring member 52B. At least one capacitor 11 is disposed on a mounting surface 51a of each substrate 51. The wiring member 52A electrically connects the respective capacitors 11 and connects the adjacent substrates 51 to each other. The wiring member 52B extends from the substrate 51 disposed on one end side.

Through holes not shown in the drawing are formed in each substrate 51 at positions corresponding to the respective leads 11a, and lands not shown in the drawing are formed on the surface of the substrate 51 in the periphery of the through holes. Each lead 11a of the capacitor 11 is inserted through the through hole formed in the substrate 51, and is soldered with the solder 18 on the land. Each of the wiring members 52A and 52B includes a pair of wirings not shown in the drawing. One wiring of the wiring member 52A is connected to one wiring of the wiring member 52B, and the other wiring of the wiring member 52A is connected to the other wiring of the wiring member 52B.

The leads 11a (for example, the positive electrode leads 11a) each of which is one of the pair of leads 11a of each capacitor 11 are commonly connected to each other, and are connected to the one wiring in the wiring member 52A and the one wiring in the wiring member 52B. The leads 11a (for example, the negative electrode leads 11a) each of which is the other of the pair of leads 11a of each capacitor 11 are commonly connected to each other, and are connected to the other wiring not shown in the drawing in the wiring member 52A and the other wiring not shown in the drawing in the wiring member 52B. That is, the respective capacitors 11 are connected in parallel to the pairs of wirings in the wiring members 52A and 52B. Note that a configuration may be adopted where the respective capacitors 11 are connected in series to the pairs of wirings in the wiring members 52A, 52B.

The mounting surface 51a of each substrate 51 is configured to have a width and a length that correspond to the number of capacitors 11 mounted on the substrate 51. The capacitors 11 are disposed such that the generatrix of each case 11b is perpendicular to the mounting surface 51a. Accordingly, when the capacitor 11 is mounted on the mounting surface 51a, it is not necessary to bend the leads 11a, and the leads 11a can be soldered to the land with the solder 18 in a state where one bottom surface of the case 11b from which the leads 11a extend is brought into contact with or facing the mounting surface 51a and the leads 11a are inserted through the through holes.

Each of the wiring members 52A, 52B may be configured of a flexible member, such as an FPC. An end portion 52Ba of the wiring member 52B is provided with the terminal portions 15 which are respectively connected to the pair of wirings. The reinforcing plate 16 is provided to the surface of the end portion 52Ba of the wiring member 52B on a side opposite to the terminal portions 15.

Other components are substantially equivalent to the corresponding components of the capacitor module 10 shown in FIG. 3.

In the embodiment having such a configuration, it is possible to increase the degree of freedom in the arrangement of the capacitors 11. For example, by bending the wiring member 52A, as shown in FIG. 9, directions of the generatrixes of two capacitors 11 may be aligned with each other or may be set to be orthogonal to each other. For example, when the capacitor module 50 is mounted on the SSD board 21, it is possible to efficiently arrange the capacitor module 50 by using an available area where other electronic components 23 are not disposed.

As described above, the present embodiment can obtain advantageous effects substantially equivalent to the advantageous effects of the first embodiment, and has an advantage of improving the degree of freedom in arrangement.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A memory system comprising:
a memory;
a controller configured to control the memory;
a first board on which the memory and the controller are mounted; and
a module component including at least one capacitor, a second board, and a wiring member, each of the at least one capacitor including a lead, the at least one capacitor being mounted on the second board, the wiring member being electrically connected to the lead of the at least one capacitor and extending from the second board, wherein
the first board and the module component are connected to each other via the wiring member.

2. The memory system according to claim 1, wherein the wiring member is configured of a flexible board.

3. The memory system according to claim 2, wherein
the first board includes a connection terminal,
the flexible board has an end portion including a terminal portion, and
the terminal portion is connected to the connection terminal by thermocompression soldering.

4. The memory system according to claim 3, further comprising a reinforcing plate configured to increase strength of the terminal portion.

5. The memory system according to claim 1, wherein
the second board is configured of a rigid layer of a rigid flexible board including the rigid layer and a flexible layer, and
the wiring member is configured of the flexible layer.

6. The memory system according to claim 1, wherein
the second board is disposed such that a mounting surface of the second board, the at least one capacitor being mounted on the mounting surface of the second board, intersects with a mounting surface of the first board, an electronic component being mounted on the mounting surface of the first board.

7. The memory system according to claim 1, further comprising an accommodating case, wherein
the first board and the module component are housed in the accommodating case.

8. The memory system according to claim 7, wherein
the accommodating case is formed to have a dimension complying with SFF-TA-1008 standard.

9. The memory system according to claim 1, wherein
each of the at least one capacitor further includes a case,
the lead extends from the case, and
the lead is inserted into a through hole formed in the second board and is soldered to the second board in a state where a portion of the case from which the lead extends faces the second board.

10. A memory system comprising:
a memory;
a controller configured to control the memory;
a first board on which the memory and the controller are mounted; and
a module component including at least one capacitor of an SMT type, a second board, and a wiring member, the at least one capacitor being mounted on the second board, the wiring member being electrically connected to the at least one capacitor and extending from the second board, wherein
the first board and the module component are connected to each other via the wiring member.

11. The memory system according to claim 10, wherein the wiring member is configured of a flexible board.

12. The memory system according to claim 11, wherein
the first board includes a connection terminal,
the flexible board has an end portion including a terminal portion, and
the terminal portion is connected to the connection terminal by thermocompression soldering.

13. The memory system according to claim 12, further comprising a reinforcing plate configured to increase strength of the terminal portion.

14. The memory system according to claim 10, wherein
the second board is configured of a rigid layer of a rigid flexible board including the rigid layer and a flexible layer, and
the wiring member is configured of the flexible layer.

15. The memory system according to claim 10, wherein
the second board is disposed such that a mounting surface of the second board, the at least one capacitor being mounted on the mounting surface of the second board, intersects with a mounting surface of the first board, an electronic component being mounted on the mounting surface of the first board.

16. The memory system according to claim 10, further comprising an accommodating case, wherein
the first board and the module component are housed in the accommodating case.

17. The memory system according to claim 16, wherein
the accommodating case is formed to have a dimension complying with SFF-TA-1008 standard.

* * * * *